US006396296B1

United States Patent
Tarter et al.

(10) Patent No.: US 6,396,296 B1
(45) Date of Patent: May 28, 2002

(54) METHOD AND APPARATUS FOR ELECTRICAL CHARACTERIZATION OF AN INTEGRATED CIRCUIT PACKAGE USING A VERTICAL PROBE STATION

(75) Inventors: Thomas S. Tarter, Campbell; Nhon T. Do, Mountain View, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/571,269

(22) Filed: May 15, 2000

(51) Int. Cl.[7] .......................... G01R 31/26; G01R 31/02
(52) U.S. Cl. ........................ 324/765; 324/754; 324/761
(58) Field of Search ................................ 324/761, 763, 324/765, 754, 755, 758; 257/692, 693, 697

(56) References Cited

U.S. PATENT DOCUMENTS

| 4,626,780 A | * | 12/1986 | Powers et al. ............... 324/754 |
| 4,742,980 A | * | 5/1988 | Heigl ....................... 248/125.9 |
| 4,751,457 A | * | 6/1988 | Veenendaal .................. 324/758 |
| 5,124,644 A | * | 6/1992 | Ganapol ...................... 324/754 |
| 5,321,453 A | * | 6/1994 | Mori et al. .................. 324/754 |
| 5,533,398 A | * | 7/1996 | Sakurai ........................ 73/573 |
| 5,656,942 A | * | 8/1997 | Watts et al. ................. 324/754 |
| 5,900,738 A | * | 5/1999 | Khandros et al. ............ 324/761 |
| 5,994,912 A | * | 11/1999 | Whetsel ...................... 324/763 |
| 6,031,282 A | * | 2/2000 | Jones et al. .................. 257/692 |
| 6,046,600 A | * | 4/2000 | Whetsel ...................... 324/763 |

\* cited by examiner

Primary Examiner—Michael J. Sherry
Assistant Examiner—Jermele Hollington

(57) ABSTRACT

An integrated circuit package test station supports an integrated circuit package under test in a vertical orientation thereby allowing simultaneous access to both sides of the package. Probe assemblies are utilized on both sides of the package to increase the accuracy, efficiency, and simplicity of performing electrical characterization of the IC package. The IC package holder as well as the probe assemblies are adjustably positioned to allow accurate and precise measurements of through-package electrical characteristics. To aid in positioning the test equipment, a dual-display image magnification system is used which provides images from both sides of the IC package simultaneously.

16 Claims, 2 Drawing Sheets

METHOD AND APPARATUS FOR ELECTRICAL CHARACTERIZATION OF AN INTEGRATED CIRCUIT PACKAGE USING A VERTICAL PROBE STATION

FIELD OF THE INVENTION

The present invention relates to integrated circuit (IC) package testing and more particularly, to testing the electrical characteristics of an IC package and its interconnect structures.

BACKGROUND OF THE INVENTION

Predicting the performance of high speed integrated circuits requires accurate measurements of the electrical characteristics of the package and the interconnect structures which interface both the integrated circuit with the package and the package with an external board. Typically, time domain reflectometry and network analysis measurements are performed to characterize the electrical performance of the package which can dominate the performance limits of high speed integrated circuits.

Electrical characteristics of packages, which are frequently the subject of measurement, include cross-coupling with neighboring lines, spectral dispersion, electrical resonances, and loss by radiation into the surrounding dielectric.

The measuring stations of the prior art are traditionally constructed to support a package under test in a horizontal position. This arrangement provides direct physical access to only a single side of the package. Simultaneous access to both sides of a package is unavailable in these test stations. Looping fixtures are often required to achieve through-package electrical characterization. Also, specially constructed mounting cards are sometimes used which not only hold a package but also attempt to provide all connections on the top of the card for easy physical access and probing. The use of looping fixtures and other package mounting cards introduce effects into the measurement data which are not due to the package or its interconnects. These effects must, themselves, be determined and either compensated for or modeled into the final analysis of the data. Regardless, of how they are handled, these effects degrade both the efficiency and accuracy of the resulting package electrical characterization.

SUMMARY OF THE INVENTION

The present invention addresses the needs for a method and apparatus to measure the electrical characteristics of an integrated circuit package in an efficient, precise and accurate manner.

The integrated circuit package test station of the present invention supports an integrated circuit package under test in a vertical orientation thereby allowing simultaneous access to both sides of the package. Probe assemblies are utilized on both sides of the package to increase the efficiency and simplicity of performing electrical characterization of the integrated circuit package. The integrated circuit package support as well as the probe assemblies are adjustably positioned to allow accurate and precise measurements of through-package electrical characteristics. To aid in positioning the test equipment, a dual-display image magnification system is used in certain embodiments which provides images of both sides of the IC package simultaneously.

The needs are also met by embodiments of the present invention which provide an electrical characterization of an IC package based on measurements from a first probe assembly which electrically probes a first side of an IC package and a second probe assembly which electrically probes a second side of the IC package, and a vertical package holder which supports the IC package in a substantially vertical orientation to allow simultaneous access to the first and second sides of the IC package.

The needs are further met by embodiments of the present invention which probe an IC package by supporting the IC package vertically wherein a first and second side of the IC package is simultaneously accessible, probing the first side of the IC package, probing the second side of the IC package, and determining an electrical characterization of the IC package based on the probing of both sides.

The foregoing features, as well as other aspects and advantages, of the present invention, will become more apparent from the following detailed description, claims and drawings.

DETAILED DESCRIPTION OF THE INVENTION

Figure 1:
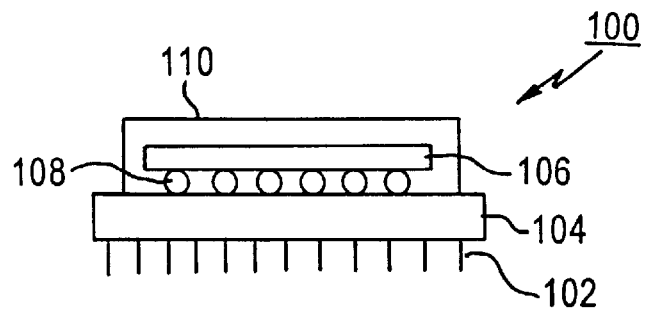
FIG. 1 illustrates an IC device for which an embodiment of the present invention performs testing.

A typical IC device 100, as depicted in FIG. 1, include s a plurality of pins 102, or other connectors, for electrically coupling the device 100 to a circuit board. The device 100 also includes a package substrate 104, die 106, and solder bumps, pads or pins 108 for connecting signal pads (not shown) of the die 106 to traces (not shown) on the substrate 104 and ultimately to the pins 102. A lid 110 seals and protects the die 106 and its connections 108 to the substrate 104. The region between the lid 110 and the substrate 104 may be filled with a resin or similar material for its protective and thermal properties.

Figure 2:
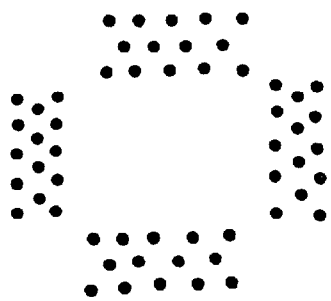
FIG. 2 illustrates an exemplary flip-chip die footprint.

The IC device 100 depicted in FIG. 1 is particularly known as a flip-chip arrangement. This arrangement of interconnections is typically used far IC dies having too many signal, or I/O, pads to be arranged along the die edges. Instead, the I/O pads are arranged on the die in an array, as depicted in FIG. 2, and solder bumps are formed on the pads. The die is then inverted and positioned on a matching array on the package substrate (FIG. 1, 104) and the solder bumps are reflowed.

A more traditional IC package positions the die face up on the package substrate and uses bonding wires to connect I/O pads on the die to corresponding pads on the substrate.

The present invention contemplates flip-chip package arrangements as well as more traditional arrangements within its scope. In either type of arrangement, the package and the interconnects between the die and the package affect the ultimate performance of an IC device utilizing the package. Therefore, an electrical characterization of the package is desirable. Within a package, the pins or connections 102 are connected through to the opposite side of substrate 104 where they are available for connection to the die 106. Like all transmission lines, these interconnections attenuate and distort the signals to and from the die 106. The electrical characterization of a package includes determining the characteristics of the package's interconnections in order to evaluate how they will impact the performance of an IC device using that package.

The electrical characterization of an IC package encompasses a number of measurements. One representative method involves injecting a signal at an I/O pad on the package substrate (FIG. 1, 104) and measuring the signal reflection and transmission characteristics. This method allows impedance and reactance measurements of an interconnect to be performed at high frequencies as well as DC voltage levels. Other methods involve measuring the effect of the injected signals on nearby interconnects. These methods allow the cross-coupling between interconnects due to mutual impedance and capacitance to be measured. Either of these methods can be performed on multiple interconnects simultaneously or only on a single interconnect.

Figure 3:
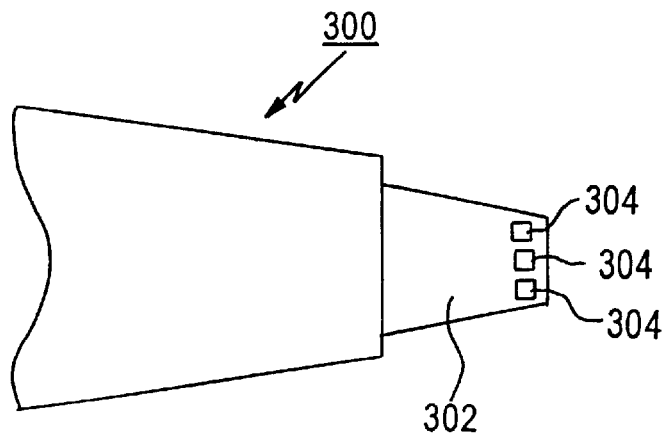
FIG. 3 illustrates a high-performance electrical probe used in certain embodiments of the present invention.

FIG. 3 depicts an exemplary probe 300 used to measure the electrical characteristics of an IC package. In one embodiment of the present invention, the probe 300 is a precision, controlled-impedance transmission line probe as is known in the art. At the end of the planar region 302 are multiple contacts 304 which communicate with selected pads and terminals of an IC package under test. The contacts 304 in this embodiment illustrate an exemplary arrangement of a signal contact between two grounds contacts. This arrangement allows the same probe, with minor positional adjustments, to be either a signal or ground connection.

Because of the typical scale of integrated circuit packages, micro-manipulators are employed to precisely position the probe 300 and its planar region 302 in relation to a package under test. Similarly, a package is sometimes socketed on a test card with contacts specifically shaped to match the shape of a probe's contact 304. Both these aids for performing electrical characterization of IC packages are useful in particular embodiments of the present invention.

Figure 4:
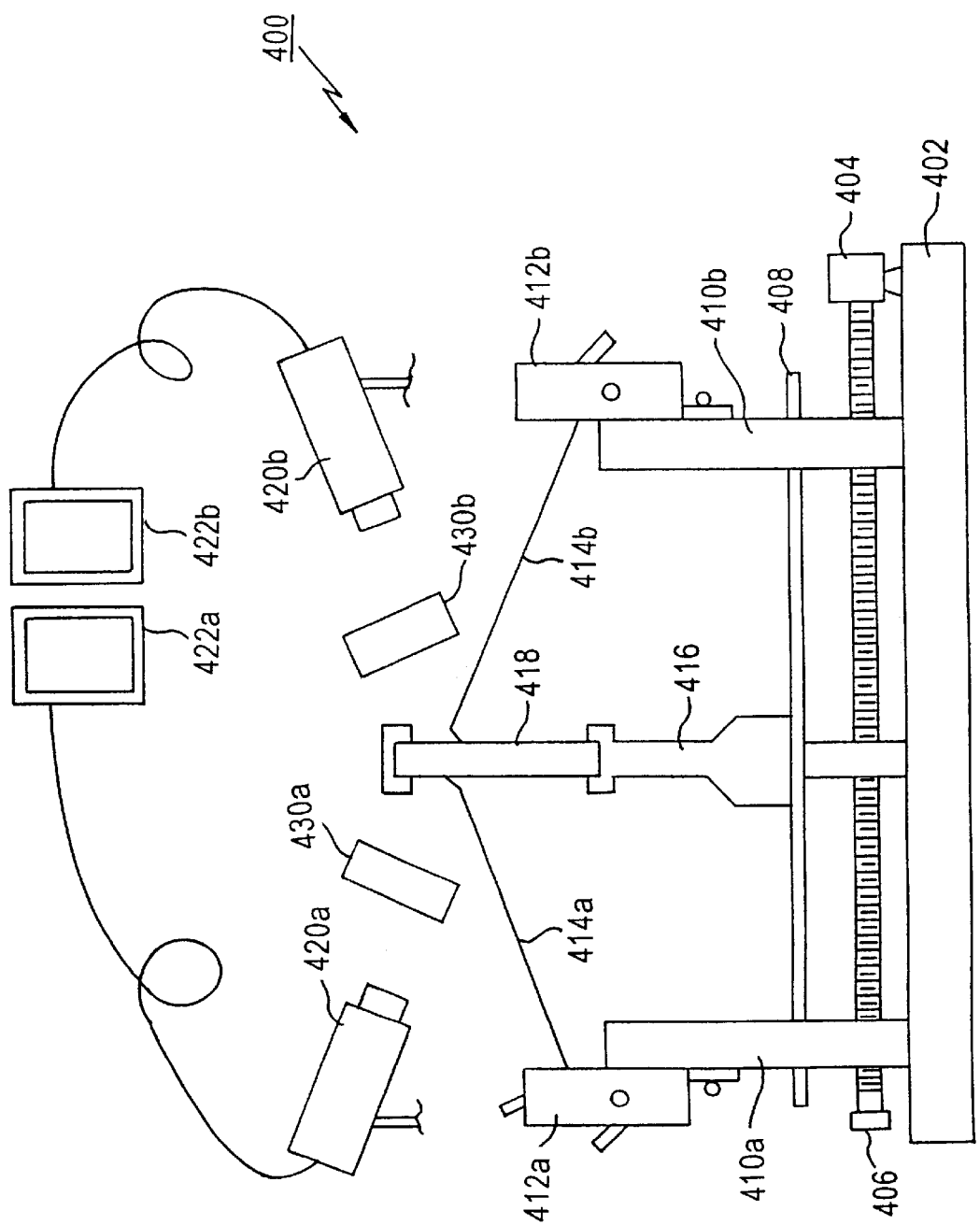
FIG. 4 illustrates a test apparatus arrangement according to an embodiment of the present invention.

FIG. 4 depicts a test station 400 according to an embodiment of the present invention. A base 402 supports two vertical platens 410a and 410b which include adjusters for gross vertical positioning of two probe manipulators 412a and 412b. A horizontal platen 408 is attached to a lead screw 406 and positioned under the control of a servo motor 404 and also can be adjusted vertically. A holder 416 for the IC package under test 418 is attached to the horizontal platen 408. The holder 416 securely holds the IC package 418 in a substantially vertical position thereby permitting physical access to both sides of the package 418 simultaneously. In particular to this embodiment, access to both probes 414a and 414b is provided by the vertical orientation of the IC package 418.

Operation and positioning of the probes 414a and 414b are accomplished by the respective probe manipulators 412a and 412b. The manipulators 412a and 412b allow the probes 414a and 414b to contact the appropriate areas of the IC package 418 and perform and collect the various electrical characterization measurements discussed earlier. Probe manipulators 412a and 412b which allow manual probe positioning, fly-by-wire probe positioning, as well as automated positioning sequences to be performed, are all considered within the scope of the present invention. Because both sides of the package under test 418 are accessible, the probes 414a and 414b are able to be positioned more efficiently, precisely and accurately than in a test station where the package is horizontally arranged and only a single side of the package is accessible. Furthermore, through-package electrical characterization can be performed by probes 414a and 414b directly in contact with both sides of the IC package 418, without the errors and other effects introduced by looping fixtures.

Certain embodiments of the present invention include two video cameras 420a and 420b and dual-displays 422a and 422b. The cameras 420a and 420b include optical components to provide a magnified image of each side of the package 418 and the position of a corresponding probe 414a or 414b in relation thereto. These images of both sides are simultaneously displayed on the corresponding display 422a or 422b and further facilitate accurate and efficient positioning of the probe 414a or 414b. Another embodiment uses optical magnifiers or microscopes 430a and 430b on each side of the IC package 418 to aid in positioning the probes 414a and 414b.

By holding a package in a vertical orientation, both sides of the package are simultaneously accessible to electrical probe assemblies. This accessibility improves the ease, accuracy and efficiency of positioning the probes. Also, through-package electrical characterization of the package and its interconnects are possible without the introduction of the errors and difficulties which accompany looping fixtures.

Although the present invention has been described and illustrated in detail, it is understood that the same is by way of illustration and example only, and is not to be taken as a limitation, in scope or spirit, of the present invention which is limited only by the terms of the appended claims.

What is claimed is:

1. An integrated circuit (IC) package test apparatus comprising:
   a first probe assembly configured to electrically probe a first side of an IC package;
   a second probe assembly configured to electrically probe a second side of the IC package; and
   a package holder configured to support the IC package in a substantially vertically-oriented position such that the first and second sides of the IC package are simultaneously accessible to the first and second probe assemblies.

2. The IC package test assembly of claim 1, wherein the package holder is adjustable in at least two axes of motion.

3. The IC package test assembly of claim 1, further comprising:
   a first optical microscope configured to view the first side of the IC package; and
   a second optical microscope configured to view the second side of the IC package.

4. The IC package test assembly of claim 1, wherein each of the first and second probe assemblies further comprise:
   a probe; and
   a manipulator configured to provide positional adjustment of the probe.

5. The IC package test assembly of claim 4, wherein the manipulator is controlled by one of a manual, automatic, and electronic method.

6. The IC package test assembly of claim 1, further comprising:
   a first camera configured to capture a first image of the first side of the IC package;
   a second camera configured to capture a second image of the second side of the IC package; and
   an image display device configured to simultaneously display both the first and second image.

7. The IC package test assembly of claim 6, wherein the image display device comprises first and second monitors.

8. The IC package test assembly of claim 1, further comprising:

a platen configured to support the package holder, wherein the platen is movable in two-axes of motion.

9. The IC package test assembly of claim 8, wherein the platen further comprises:

a lead screw;

a servo-motor which rotates the lead screw, wherein rotation of the lead screw moves the platen.

10. A method in an IC package tester comprising the steps:

supporting an IC package in a substantially vertical orientation, wherein a first and second side of the IC package are simultaneously accessible;

probing the first side of the IC package;

probing the second side of the IC package; and determining an electrical characterization of the package based on the steps of probing the first and second sides of the IC package.

11. The method of claim 10, wherein each of the steps of probing include:

adjusting a position of a probe on a side of the IC package.

12. The method of claim 10, wherein the step of adjusting includes:

displaying an image of the first and second sides on a video display.

13. The method of claim 10, wherein the step of determining an electrical characterization includes determining one of an inductance performance, capacitive performance, resistive performance, high-frequency performance.

14. The method of claim 10, wherein the step of determining an electrical characterization includes the step of determining a through-package electrical characterization.

15. The method of claim 11, wherein the step of adjusting includes:

controlling a manipulator which determines the position of the probe.

16. The method of claim 15, wherein the step of controlling the manipulator is performed by one of a manual, automatic, and electronic method.

* * * * *